United States Patent [19]
Sugie et al.

[11] Patent Number: 5,445,153
[45] Date of Patent: Aug. 29, 1995

[54] ORTHOGONAL RF COIL FOR MRI APPARATUS

[75] Inventors: Masami Sugie, Kusatsu; Hirofumi Asako, Kyoto, both of Japan

[73] Assignee: Shimadzu Corporation, Kyoto, Japan

[21] Appl. No.: 187,540

[22] Filed: Jan. 28, 1994

[30] Foreign Application Priority Data

Jan. 31, 1993 [JP] Japan ................................. 5-034170
Jan. 31, 1993 [JP] Japan ................................. 5-034171

[51] Int. Cl.6 ............................................. A61B 5/055
[52] U.S. Cl. ................................. 128/653.5; 324/318;
324/322
[58] Field of Search .......................... 128/653.2, 653.5;
324/309, 318, 322, 307

[56] References Cited

U.S. PATENT DOCUMENTS 5,216,368  6/1993  Leussler .............................. 324/318
5,245,285  9/1993  Ishizuka et al. ..................... 324/318

FOREIGN PATENT DOCUMENTS 0151745   8/1985  European Pat. Off. .
0290187  11/1988  European Pat. Off. .
3705314A1 8/1987  Germany .
4038106A1 6/1991  Germany .

OTHER PUBLICATIONS

"A Quadrature Coil for the Adult Human Head", Sank et al, Journal of Magnetic Resonance, vol. 69, 1986, pp. 236-242.

Primary Examiner—Ruth S. Smith
Attorney, Agent, or Firm—Nikaido, Marmelstein, Murray & Oram

[57] ABSTRACT

An orthogonal RF (radio frequency) coil for use in an MRI (Magnetic Resonance Imaging) apparatus includes two resonator coil loops arranged to have sensitivity directions orthogonal to each other, each of the resonator coil loops having two power supply points; and power supply circuits for supplying power so as to provide a 90° RF phase difference between the two power supply points of one of the resonator coil loops and the two power supply points of the other resonator coil loop, and a 180° RF phase difference between the two power supply points of each of the resonator coil loops at a frequency establishing a differential mode. The RF phase difference between the two power supply points of each resonator coil loop is forcibly inverted at the frequency establishing the differential mode. This cancels in-phase resonance currents of the differential mode, to enhance the orthogonality of RF magnetic fields.

12 Claims, 8 Drawing Sheets

90° phase power divider

ORTHOGONAL RF COIL FOR MRI APPARATUS

BACKGROUND OF THE INVENTION

1. Background of the Invention

This invention relates to MRI (Magnetic Resonance Imaging) apparatus, and more particularly to orthogonal RF (radio frequency) coils for use in generating high frequency magnetic fields to excite magnetization in the body of an examinee, and detecting NMR (Nuclear Magnetic Resonance) signals generated with mitigation of the magnetization excited.

2. Description of the Related Art

An orthogonal RF coil used in an MRI apparatus has two electrically independent resonator coil loops formed orthogonal to each other. Such a coil is useful in that the two coil loops consume half the high frequency power consumed by a single resonator coil loop when effecting excitation needed for MR imaging, and provide a $\sqrt{2}$ times S/N ratio when receiving NMR signals. In order to approximate the above theoretical values, it is important for this orthogonal RF coil to attain a high degree of independence or orthogonality between the two resonator coil loops. The orthogonality of the two resonator coil loops refers to a 90° displacement in vector direction between high frequency (RF) magnetic fields generated by the respective coils in signal transmission, and a 90° displacement in vector direction between NMR signals detected by the respective coils in signal reception.

FIG. 1 shows a first type of known orthogonal RF coil. In FIG. 1, four linear conductors 11–14 are connected at opposite ends thereof to ring-shaped conductors 15 and 16 through capacitors 31–34 and 35–38. The ring-shaped conductors 15 and 16 include capacitors 21–24 and 25–28 arranged in series, respectively. The linear conductors 11 and 13, ring-shaped conductors 15 and 16, and capacitors 31, 33, 35 and 37 form one resonator coil loop, while the linear conductors 12 and 14, ring-shaped conductors 15 and 16, and capacitors 32, 34, 36 and 38 form the other resonator coil loop. Power is supplied to points B and C from a 90° phase power divider 51. Capacitors 39 and 40 are provided to effect impedance matching.

In this example, the capacitors 21–28 have a relatively large capacity, with mainly capacitors 31–38 acting to adjust resonance frequencies to obtain a steady characteristic (i.e. maintenance of the orthogonality noted above). Each of the capacitors in the groups of four capacitors 21–24, 25–28, 31–34 and 35–38 have substantially the same capacity.

Resonance currents as shown in FIG. 2A flow through this type of orthogonal RF coil. In FIG. 2A, resonance currents shown in solid lines and those shown in dotted lines flow independently of each other. The current flowing through point C and the current flowing through point A are in phase inversion. Similarly, the current flowing through point B and the current flowing through point D are in phase inversion. These independent currents generate RF magnetic fields orthogonal to one another. Consequently, it is useful in MR imaging to establish a resonance mode with such current flows at NMR resonance frequencies (imaging mode).

On the other hand, there exists also a resonance mode (differential mode) with resonance currents flowing as shown in FIG. 2B. In this mode, the currents flow commonly through linear conductors 11–14, with no independence thereamong. The current flowing through point C and the current flowing through point A are in phase, and so are the current flowing through point B and the current flowing through point D. A composition of RF magnetic fields centrally of the RF coil is zero, and so this mode generally cannot be used as an imaging mode.

However, the known orthogonal RF coil has a drawback of providing a poor orthogonality of RF magnetic fields. That is, the frequency establishing the imaging mode and the frequency establishing the differential mode often become close to each other because of the balance of capacitance and inductance in the RF coil or the like. In such a case, the resonance currents in the differential mode are combined with the resonance currents in the image mode, thereby degrading the orthogonality of RF magnetic fields in the imaging mode.

Known cylindrical RF coils as described above include what is known as a birdcage coil and a distributed cosine coil. Each of these cylindrical RF coils has numerous linear conductors extending parallel to a cylinder axis. In a resonant state, each linear conductor receives a cos θ current corresponding to a spatial position θ thereof, thereby generating high frequency magnetic fields of excellent uniformity (see Japanese Patent Publication 3-50541 for the birdcage coil, and Bolinger et al., J. Magnetic Resonance, 81, 162, 1988 for the distributed cosine coil).

FIG. 3 shows an example of birdcage coils having eight linear conductors. In FIG. 3, the eight linear conductors 111–118 are connected at opposite ends thereof to two ring-shaped conductors 181 and 182. In a resonant state, highly uniform magnetic fields are generated when the eight linear conductors 111–118 form a current distribution as shown in FIG. 4.

As shown in FIG. 5, a distributed cosine coil has linear conductors 211–230 each connected at one end (upper end) thereof to a ring-shaped conductor 281. The other ends (lower ends) of linear conductors 211–230 are joined to form groups (groups of five each in the drawing) to be connected to a ring-shaped conductor 282 through capacitors 251–254. In the drawing, the dotted lines represent an orthogonal type construction (with solid line portions and linear portions generating magnetic fields at 90° to one another).

However, the conventional RF coils have the problems that the uniformity of magnetic fields is impaired as a result of frequency adjustment, and that adjustment to keep the uniformity of magnetic fields is difficult.

Specifically, for use in an MRI apparatus, it is necessary to bring the resonance frequency of the RF coil into agreement with NMR resonance frequency, and tuning capacitors must be adjusted. In the example shown in FIG. 3, the capacitors 131–138 are selected while maintaining the capacity thereof, to adjust the resonance frequency. To maintain a high degree of uniformity of magnetic fields, the capacitors corresponding in number to the linear conductors must be varied while maintaining the capacity thereof equal as noted above. Such an adjusting operation is extremely difficult. If frequency adjustment is effected by varying only certain capacitors to simplify the operation, the distribution of currents flowing through the linear conductors will deviate from what is shown in FIG. 4 and impair the uniformity of magnetic fields.

With the distributed cosine coil shown in FIG. 5, the current distribution is determined only by inductance of each linear conductor. It is therefore difficult to obtain an ideal current distribution, and the current distribution cannot be adjusted once a shape has been determined. That is, the currents flowing through the linear conductors 211, 212 and 213, for example, are determined by line lengths up to points 272, 273 and 274, respectively. It is thus impossible to effect adjustment for enhancing the uniformity of magnetic fields. Further, the linear conductors 211-215 and ring-shaped conductor 281 form a direct current type closed loop. This closed loop is guided by a pulse-like application of gradient magnetic fields during MR imaging, to generate over-currents detrimental to reconstructed images.

SUMMARY OF THE INVENTION

Having regard to the state of the art noted above, an object of this invention is to provide an improved orthogonal RF coil for use in an MRI apparatus, which suppresses undesirable non-imaging mode currents, thereby to enhance the orthogonality of RF magnetic fields in an imaging mode.

Another object of this invention is to provide an improved orthogonal RF coil for use in an MRI apparatus, which maintains the uniformity of magnetic fields with ease even when frequency adjustment is made.

The above objects are fulfilled, according to this invention, by an orthogonal RF coil for use in an MRI apparatus, comprising:

two resonator coil loops arranged to have sensitivity directions orthogonal to each other, each of the resonator coil loops having two power supply points; and power supply means for supplying power so as to provide a 90° RF phase difference between the two power supply points of one of the resonator coil loops and the two power supply points of the other resonator coil loop, and a 180° RF phase difference between the two power supply points of each of the resonator coil loops at a frequency establishing a differential mode.

According to this invention, power is supplied to the two power supply points of each resonator coil loop to cause a 180° phase difference between the two power supply points at the frequency establishing the differential mode. This cancels resonance currents in the differential mode which are in phase at the two power supply points. As a result, the orthogonality of RF magnetic fields in the imaging mode is enhanced.

The two resonator coil loops are formed, for example, by:

four linear conductors extending parallel to one another and arranged at substantially 90° intervals in a circumferential direction; and two ring-shaped conductors to which opposite ends of the linear conductors are connected through first capacitors, respectively;

the power supply points being disposed at connections where the linear conductors are connected through the first capacitors to one of the ring-shaped conductors, an opposed pair of the power supply points receiving power of 180° RF phase difference therebetween.

Preferably, the two ring-shaped conductors include second capacitors arranged between the connections to which the linear conductors are connected, respectively, in order to shield direct current components guided by gradient magnetic fields.

Preferably, the two resonator coil loops are formed by:

four x n (n being an integer 2 or more) linear conductors extending parallel to one another and arranged in a circumferential direction, the linear conductors being joined together at one ends thereof to form four groups of n linear conductors each, the groups being arranged at substantially 90° intervals;

a first ring-shaped conductor to which the other ends of the linear conductors are connected through first capacitors, respectively; and a second ring-shaped conductor to which the groups of the linear conductors joined together at the one ends are connected through second capacitors, respectively;

the power supply points being disposed at connections where the groups of the linear conductors are connected through the second capacitors to the second ring-shaped conductor, an opposed pair of the power supply points receiving power of 180° RF phase difference therebetween.

With the two resonator coil loops having the above construction, the 4 × n linear conductors have a current distribution determined by the first capacitors. Thus, the current distribution may be selected by varying the first capacitors, to secure uniformity of magnetic fields generated. Aside from the uniformity of magnetic fields, frequency adjustment may be effected by varying the second capacitors. With the adjustment of the uniformity of magnetic fields and the frequency adjustment being made separately, it is easy to carry out the frequency adjustment while maintaining the uniformity of magnetic fields.

Preferably, the first and second ring-shaped conductors include third capacitors arranged between the connections to which the linear conductors are connected, respectively, in order to shield direct current components guided by gradient magnetic fields.

Preferably, each of the groups includes an odd number of the linear conductors, in order to facilitate adjustment of the orthogonality of RF magnetic fields.

It is desirable that the power supply means includes:

a 90° phase power divider for outputting two high frequency signals having a 90° phase difference;

a first differential power supply circuit for receiving a 0° phase high frequency signal from the 90° phase power divider, and generating a 0° phase high frequency signal and 180° phase high frequency signal, the first differential power supply circuit outputting the 0° phase high frequency signal to one of the power supply points of one of the resonator coil loops, and outputting the 180° phase high frequency signal to the other power supply point of the one of the resonator coil loops; and a second differential power supply circuit for receiving a 90° phase high frequency signal from the 90° phase power divider, and generating a 90° phase high frequency signal and 270° phase high frequency signal, the second differential power supply circuit outputting the 90° phase high frequency signal to one of the power supply points of the other resonator coil loop, and outputting the 270° phase high frequency signal to the other power supply point of the other resonator coil loop.

Specifically, each of the first and second differential power supply circuits includes a bridge circuit with two capacitors opposed to each other and having the same capacity C, and two inductances opposed to each other and having the same value L, the capacity C and the value L satisfying $(\frac{1}{2}\pi)$ C·L = $f$ (where f is a resonance frequency establishing the differential mode);

the bridge circuit of the first differential power supply circuit including two opposed connecting points connected to the two power supply points of the one of the resonator coil loops, respectively, and two further opposed connecting points connected through a transmission line to a 0° phase high frequency signal output terminal of the 90° phase power divider; and the bridge circuit of the second differential power supply circuit including two opposed connecting points connected to the two power supply points of the other resonator coil loop, respectively, and two further opposed connecting points connected through a transmission line to a 90° phase high frequency signal output terminal of the 90° phase power divider.

With the first and second differential power supply circuits having the above construction, power is supplied to the two power supply points of each resonator coil loop in a forcibly inverted phase condition at the resonance frequency establishing the differential mode. As a result, the differential mode resonance currents in phase are canceled.

Preferably, the capacity C and the inductance L satisfy $$L/C = Z_o \cdot Z_i$$

where $Z_o$ is impedance of the orthogonal RF coil, and $Z_i$ is impedance of the transmission line leading to the 90° phase power divider. With such value setting, no capacitors are required for impedance matching of the RF coil.

Further, at least one of the capacitors included in the bridge circuit, preferably, is a variable capacitor. The differential mode currents may be eliminated with increased precision through fine adjustment of the capacity of the variable capacitor.

It is preferred that each of the first and second differential power supply circuits further includes:

a parallel resonance circuit with a different capacitor and a different inductance, the parallel resonance circuit having the same resonance frequency as a resonance frequency establishing the differential mode, and having a switch connected in series to the different capacitor; and a different variable capacitor connected in series to the parallel resonance circuit;

one end of the parallel resonance circuit being connected along with one of the connecting points of the bridge circuit to one of the power supply points of the one of the resonator coil loops, and one end of the different variable capacitor being connected along with the other connecting point of the bridge circuit to the other power supply point of the one of the resonator coil loops.

The above switch is turned on when the RF coil is driven. As a result, the parallel resonance circuit becomes a high impedance state at the resonance frequency in the differential mode. This state of the parallel resonance circuit is equivalent to a disconnected state, whereby the above bridge circuit alone is operative. At the frequency "of" in the image mode, the bridge circuit and parallel resonance circuit are a constant having a certain value, which may be considered equivalent to the impedance of each resonator coil loop to which this constant is added. Consequently, by adjusting the variable capacitor connected to the parallel resonance circuit, only frequency "fo" may be adjusted without influencing frequency "f". The switch is turned off when the RF coil is not operated. Then, the frequency of the resonator coil loops may be varied to a great extent, to enhance an effect of decoupling with respect to other RF coils.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENTS

Preferred embodiments of this invention will be described in detail hereinafter with reference to the drawings.

First Embodiment

Figure 6:
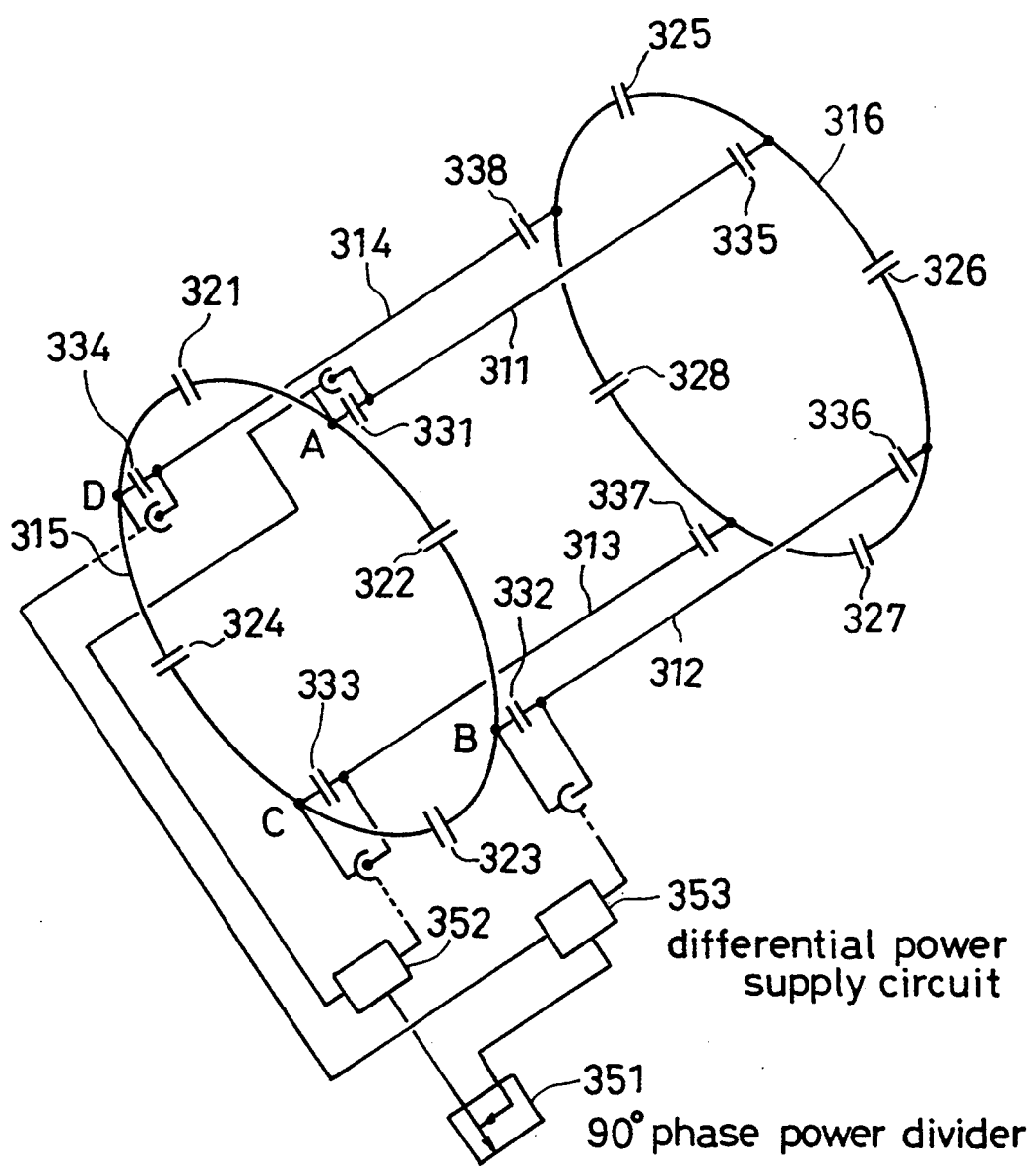
FIG. 6 is a schematic view of an orthogonal RF coil in a first embodiment of this invention.

As shown in FIG. 6, an orthogonal RF coil in a first embodiment of this invention has four linear conductors 311–314 extending parallel to a cylinder axis and arranged equidistantly at intervals of 90° circumferentially of the cylinder. Each of the linear conductors 311–314 is connected at one end thereof to a ring-shaped conductor 315 through a capacitor 331, 332, 333 or 334, and at the other end to a ring-shaped conductor 316 through a capacitor 335, 336, 337 or 338. The ring-shaped conductors 315 and 316 include capacitors 321–324 and 325–328 arranged in series, respectively.

The linear conductors 311 and 313, ring-shaped conductors 315 and 316, and capacitors 331, 333, 335 and 337 form one resonator coil loop, while the linear conductors 312 and 314, ring-shaped conductors 315 and 316, and capacitors 332, 334, 336 and 338 form the other resonator coil loop.

The linear conductors 311–314 and ring-shaped conductors 315 and 316 are formed of copper sheet or copper piping, for example. The linear conductors 311–314 have a length, and the ring-shaped conductors 315 and 316 have a diameter, suitably selected according to the size of a subject for imaging.

The capacitors 321–328 are provided for shielding direct current components mainly due to gradient field coupling, and have a relatively large capacity (e.g. several thousand to 10,000 pF). The resonance frequency of each resonator coil loop is adjusted mainly by the capacitors 331–338. The capacitors 331–338 have a relatively small capacity (e.g. several ten to several hundred pF). Each of the capacitors in the groups of four capacitors 321–324, 325–328, 331–334 and 335–338 have substantially the same capacity as other capacitors in the same group. Each capacitor comprises a ceramic capacitor, for example, which involves only a small high frequency loss.

The ring-shaped conductors 315 and 316 are not limited to a circular shape, but may be formed elliptic as desired. Further, it is not absolutely necessary to arrange the linear conductors 311–314 equidistantly at the intervals of 90° but may be arranged at irregular intervals. In this case, the capacities of the respective capacitors 331–338 may be adjusted so that the respective resonator coil loops may generate magnetic fields orthogonal to each other.

Figure 1:
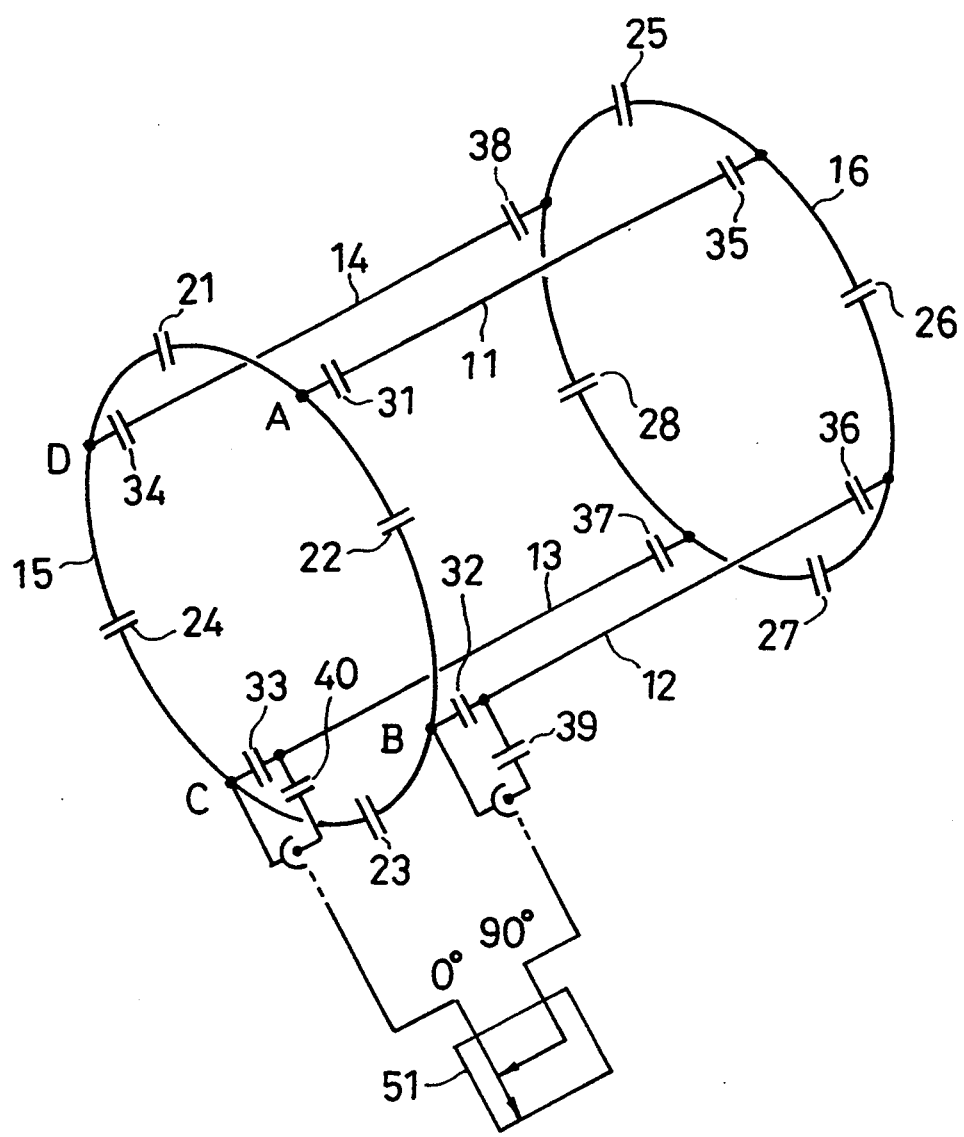
FIG. 1 is a schematic view of an orthogonal RF coil known in the art.

The foregoing construction is basically the same as the first known example shown in FIG. 1. The characterizing feature of this embodiment resides in that power is supplied at four points A, B, C and D of connection between the four linear conductors 311–314 and one ring-shaped conductor 315. Specifically, a differential power supply circuit 352 is connected to point A and point C, and a differential power supply circuit 353 to point B and point D. As a result, point A and point C have a 180° phase difference therebetween, while point B and point D also have a 180° phase difference therebetween. The two differential power supply circuits 352 and 353 receive power in 90° phase difference from a 90° phase power divider 351.

Figure 7:
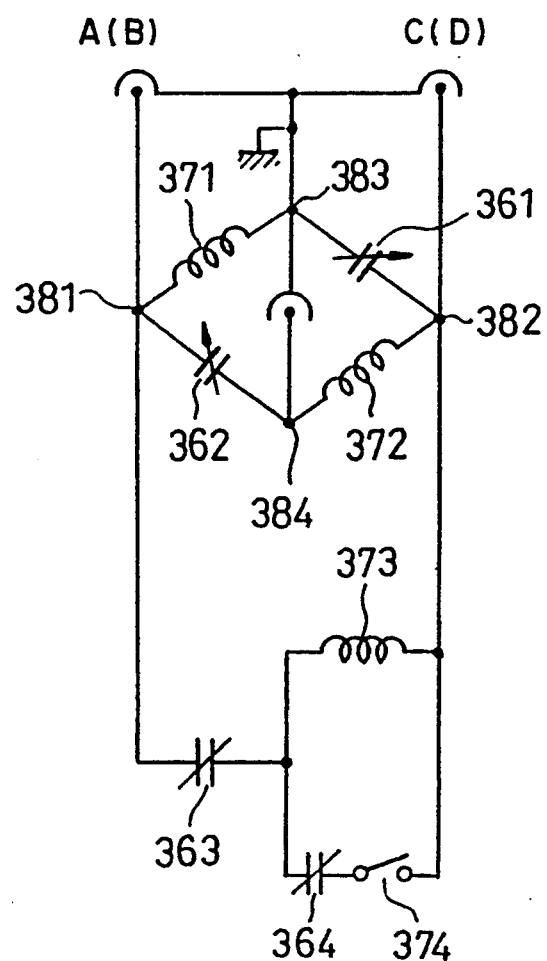
FIG. 7 is a diagram showing a differential power supply circuit in the first embodiment.

Each of these differential power supply circuits 352 and 353 has a construction as shown in FIG. 7. In FIG. 7, capacitors 361 and 362 and inductances 371 and 372 form a bridge circuit, with two opposite points 381 and 382 connected to point A (B) and point C (D) of the RF coil, respectively, and two other opposite points 383 and 384 connected to a transmission line leading to the 90° phase power divider 351. Normally, the capacitors 361 and 362 have the same capacity C, and the inductances 371 and 372 also have the same value L, which satisfy the following equation:

$$(\tfrac{1}{2}\pi)\sqrt{C \cdot L} =$$

where f is a resonance frequency in a differential mode. The above values also satisfy the following equation:

$$L/C = Z_o \cdot Z_i$$

where Zo is the impedance of the RF coil, and Zi is the impedance of the transmission line leading to the 90° phase power divider 351. This feature dispenses with impedance matching capacitors as used in the conventional RF coil.

Figure 2A:
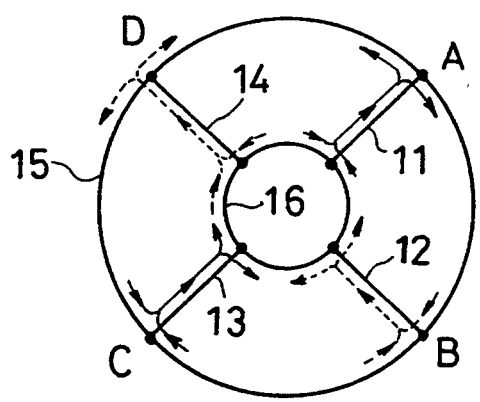
FIG. 2A is a view showing a current distribution in an imaging mode according to the prior art.
Figure 2B:
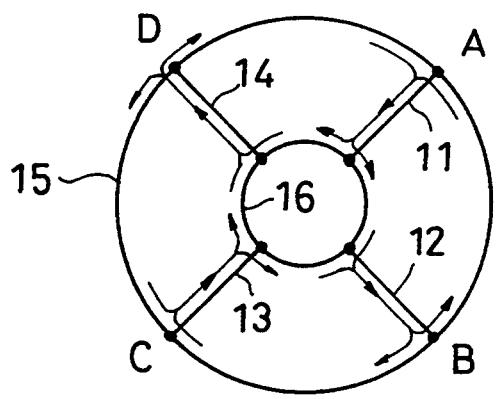
FIG. 2B is a view showing a current distribution in a differential mode according to the prior art.
Figure 3:
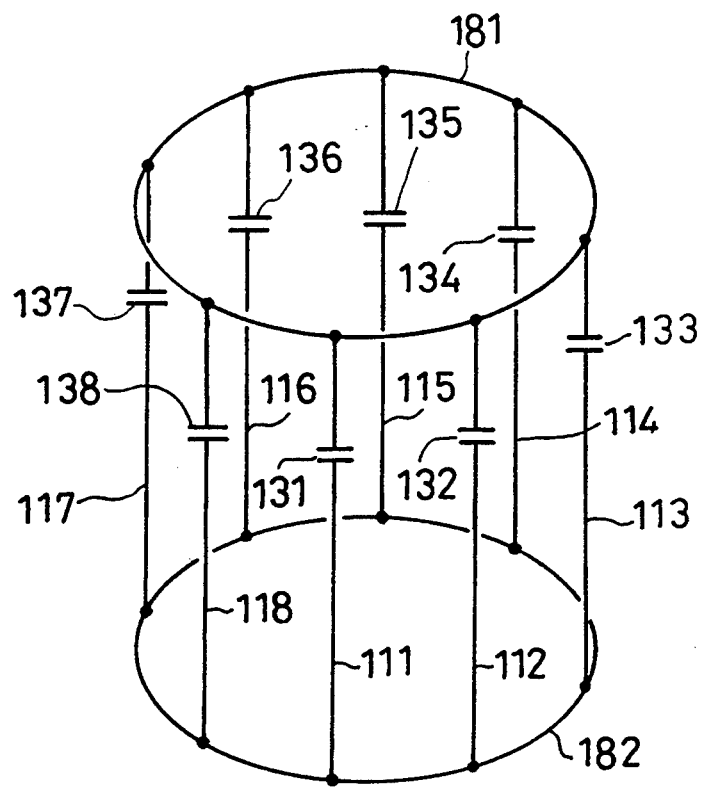
FIG. 3 is a schematic view of a birdcage coil known in the art.
Figure 4:
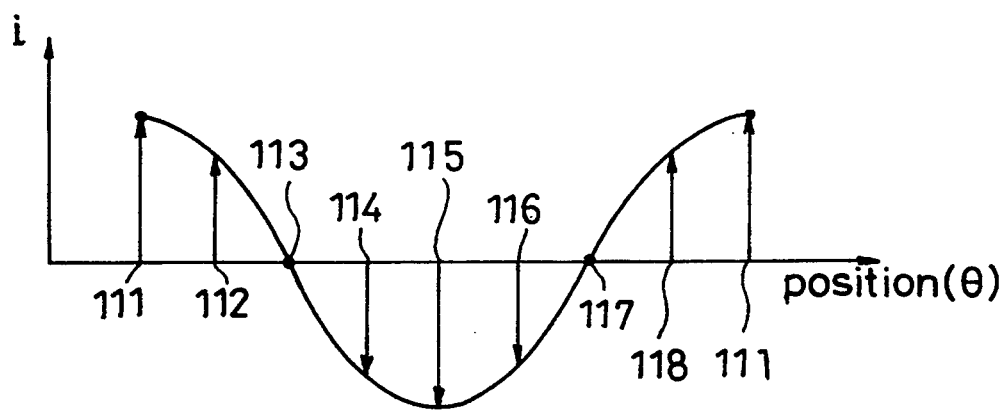
FIG. 4 is a view showing a current distribution in the birdcage coil.
Figure 5:
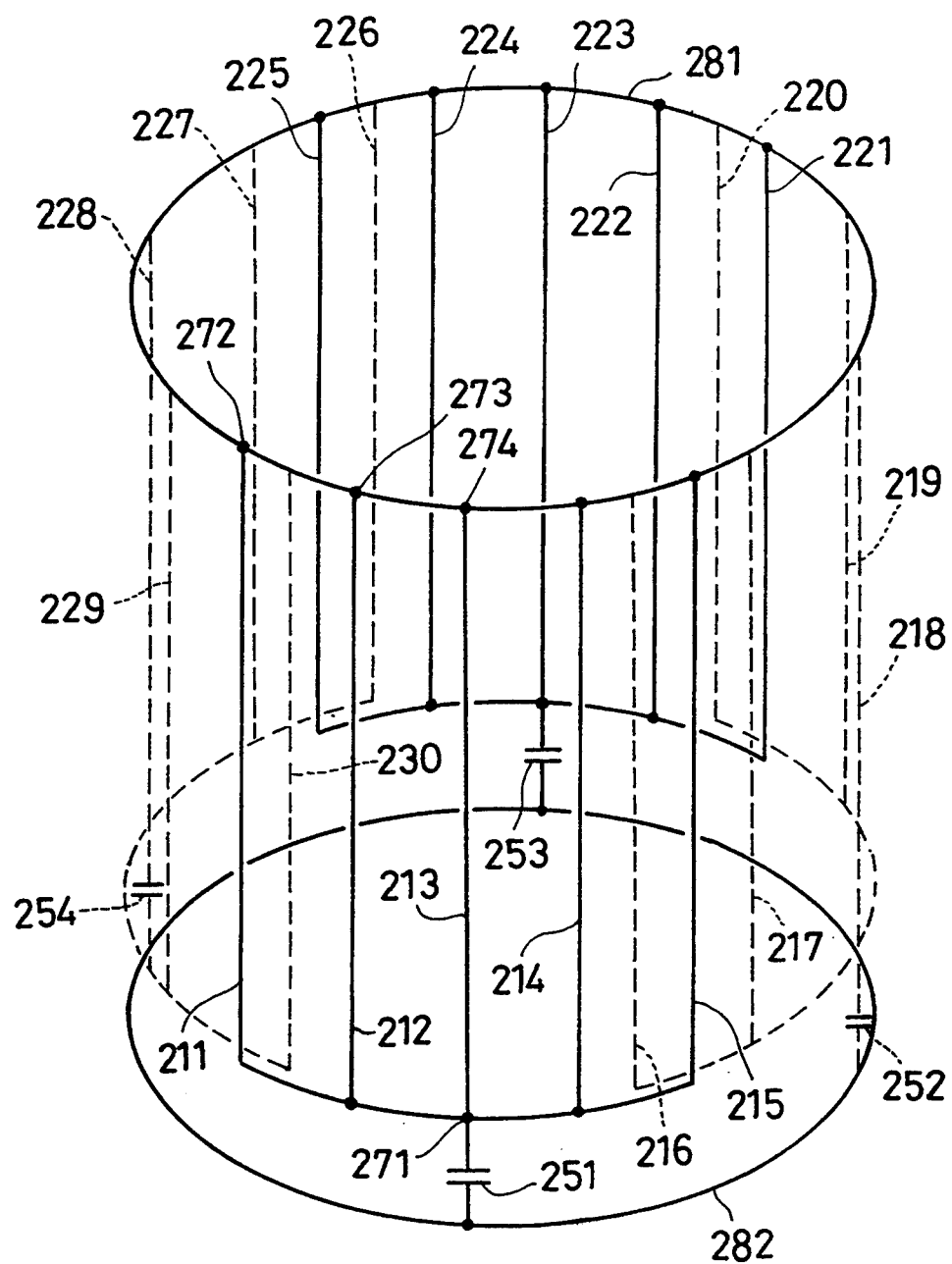
FIG. 5 is a schematic view of a distributed cosine coil known in the art.

With this construction, point A and point C may receive RF currents in 180° phase inversion at frequency "f" above, and so may point B and D, thereby canceling the differential mode currents shown in FIG. 2B (i.e. in-phase currents at points A and C, and in-phase currents at points B and D). This excludes the influences on the currents in the imaging mode to enhance the orthogonality of RF magnetic fields in the imaging mode. To eliminate the differential mode currents with greater assurance, the capacitor 361 or 362 may be given a fine-adjustable capacity. Although FIG. 7 illustrates both of these capacitors as being variable, one or both of these capacitors can have a fixed capacitance.

As shown in FIG. 7, each of the differential power supply circuits 352 and 353 further includes variable capacitors 363 and 364, an inductance 373 and a switch 374. The capacitor 364 has a capacity Ca, and the inductance 373 has a value La, which satisfy the following equation:

$$((\tfrac{1}{2}\pi)\, Ca \cdot La = f$$

When the switch 374 is turned on to cancel the differential mode, a parallel resonance circuit formed by the capacitor 364 and inductance 373 becomes a high impedance state at the resonance frequency "f" in the differential mode. This state of the parallel resonance circuit is equivalent to a disconnected state, whereby the above bridge circuit alone is operative. Assuming that the frequency in the image mode is "fo", the bridge circuit and parallel resonance circuit are a constant having a certain value, which may be considered equivalent to the capacitors 331 and 333 or capacitors 332 and 334 to which this constant is added. Consequently, with the capacitor 363 adapted variable, only frequency "fo" may be adjusted without influencing frequency "f". That is, the frequency in the image mode may be adjusted for the respective resonator coil loops with the 90° phase difference without impairing their balance, through an adjustment made in one location. Further, since the bridge circuit has an impedance varying function as noted above, the capacitor 363 is allowed a wide range of frequency adjustment.

When the switch 374 is turned off, the capacitor 364 and inductance 373 form a series resonance circuit. This series resonance circuit may have low impedance for frequency "fo" in the imaging mode. Then, the currents at points A (or B) and C (or D) are substantially in phase, whereby the resonator coil loops largely deviate from a resonant condition. This results in an enhanced effect of decoupling with respect to other RF coils mounted in the same MRI apparatus.

Second Embodiment

Figure 8:
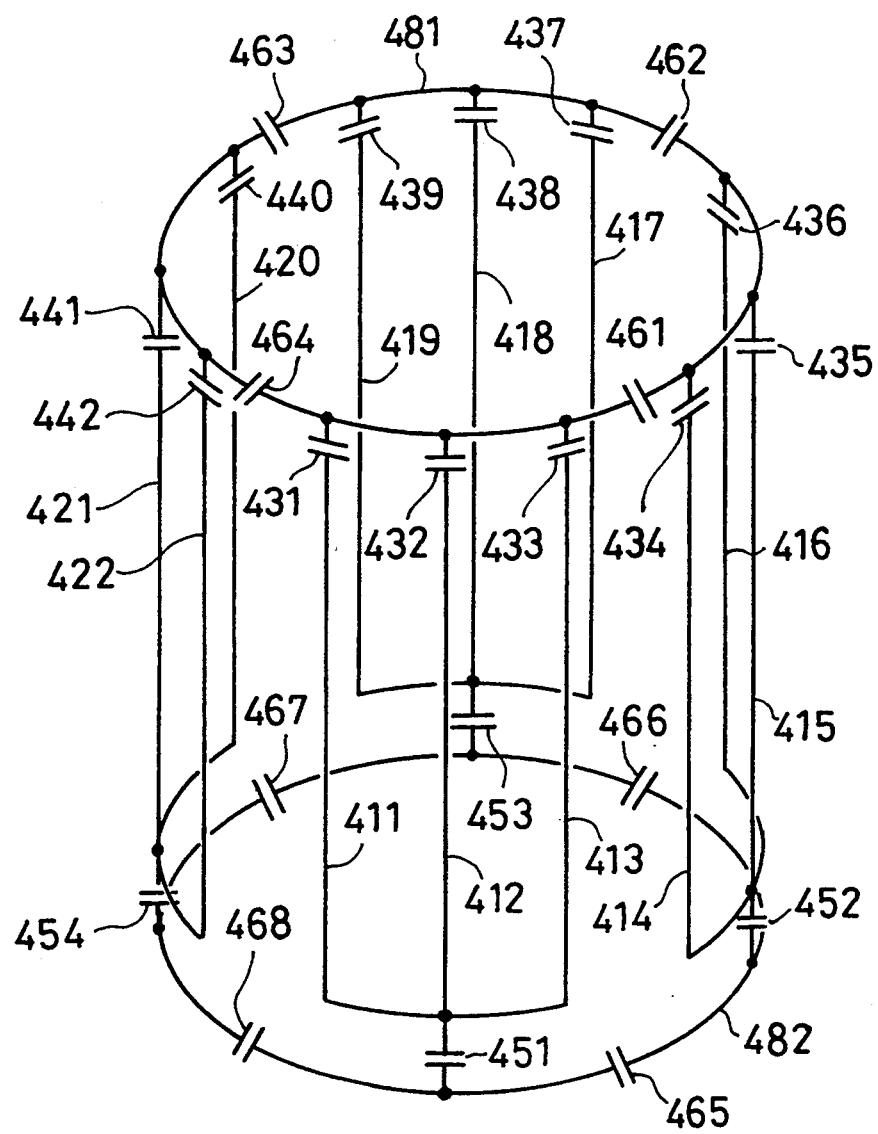
FIG. 8 is a schematic view of an orthogonal RF coil in a second embodiment of this invention.

As shown in FIG. 8, an orthogonal RF coil in a second embodiment of this invention has 12 linear conductors 411–422 extending parallel to a cylinder axis and arranged equidistantly circumferentially of the cylinder. Specifically, the linear conductors 411–422 are arranged at intervals of 30° circumferentially of the cylinder. The linear conductors 411–422 are connected at upper ends thereof to one ring-shaped conductor 481 through capacitors 431–442, respectively. The lower ends of linear conductors 411–422 are joined to form groups of three each and connected to the other ring-shaped conductor 482 through capacitors 451–454. These groups are connected to the ring-shaped conductor 482 at intervals of 90°. The upper and lower ring-shaped conductors 481 and 482 include capacitors 461–468 arranged between adjacent groups of three linear conductors each, respectively. These capacitors 461–468 are provided for cutting currents guided to the ring-shaped conductors 481 and 482 by gradient magnetic fields, and have a sufficient size for the resonance capacity.

The number of linear conductors with the lower ends joined to form each group is not limited to three, but may be any desired plural number. However, an odd number is desirable to facilitate adjustment of the orthogonality of magnetic fields. The RF coil may have a size selected according to the size of a subject for imaging. For photographing heads, for example, the RF coil should be 30 cm long and 28 cm in diameter.

Figure 9:
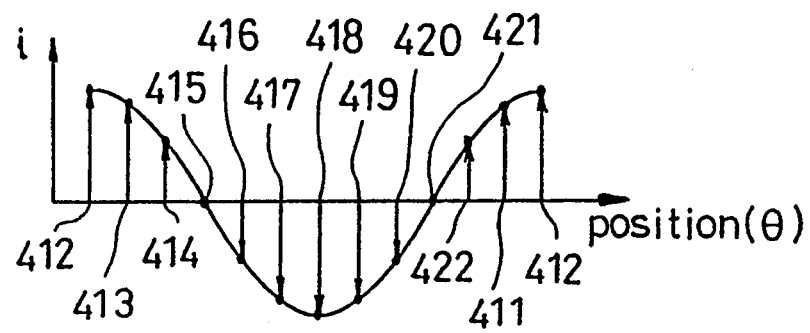
FIG. 9 is a view showing a current distribution in the second embodiment.

In order to generate uniform magnetic fields with this RF coil, the 12 linear conductors 411–422 are caused, in a resonant condition, to generate a current distribution as shown in FIG. 9, according to the respective angular positions 8 circumferentially of the cylinder. In FIG. 9, currents flowing upward in FIG. 8 are regarded as positive. In the resonant condition, the currents supplied from the capacitors 451–454 to the respective groups of three linear conductors 411–422 each have 90° phase shifts according to the positions of the groups.

In each group of three linear conductors with the lower ends joined together, it is adequate to obtain current intensities corresponding to angles of spatial positions of the linear conductors. Taking linear conductors 411, 412 and 413, for example, the currents flowing therethrough are determined by the impedance due to the linear conductors per se and the capacitors connected thereto. That is, the currents are determined by the impedance due to the linear conductor 411 and capacitor 431, by the impedance due to the linear conductor 412 and capacitor 432, and by the impedance due to the linear conductor 413 and capacitor 433. In an RF coil of a size for ordinary use, arcuate portions are far shorter than the linear conductors 411, 412 and 413. Thus, the impedance of the middle linear conductor 412 may be regarded as substantially the same as the impedance of the opposite side linear conductors 411 and 413. The currents through the three linear conductors 411–413 may therefore be determined only by the capacitors 431–433. The capacitors 431–433 may be selected so that currents flow through the side linear conductors 411 and 413 in a quantity corresponding to cos 30° of the quantity of current flowing through the middle linear conductor 412.

This applies to the other groups of three linear conductors. Thus, the capacitors 431, 434, 437 and 440 may be equalized, and so are the capacitors 432, 435, 438 and 441 and the capacitors 433, 436, 439 and 442. The 12 linear conductors 411–422 are arranged equidistantly at intervals of 30° circumferentially of the cylinder as noted above. This arrangement is adopted in order to attain a maximum uniformity of magnetic fields. With such an equidistant arrangement, the capacitors 431, 433, 434, 436, 437, 439, 440 and 442 may be equalized. While the respective capacitors may be selected to suitable values as noted above, the following values are selected in this embodiment. The capacitors 451–454 are selected to be about 100 pF, the capacitors 432, 435, 438 and 441 to be about 120 pf, the capacitors 431, 433, 434, 436, 437, 439, 440 and 442 to be about 80 pF, and the capacitors 461–468 to about 10,000 pF.

The current distribution may be set by selecting the capacitors 431–442, thereby to generate uniform orthogonal magnetic fields. Thus, frequency adjustment may be effected through selection of capacitors 451–454 without impairing the uniformity of magnetic fields.

Figure 10:
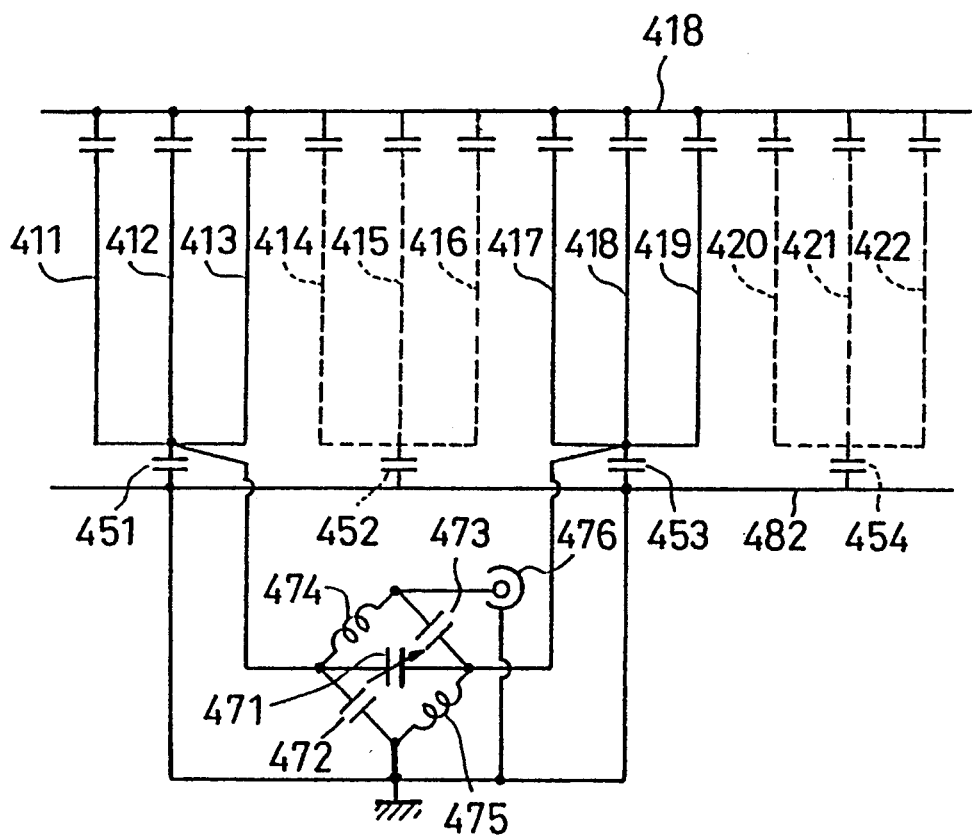
FIG. 10 is a diagram showing a power supply circuit in the second embodiment.

The pair of capacitors 451 and 453 and the pair of capacitors 452 and 454 supply RF currents of 90° phase difference to positions between the linear conductors 411 and the ring-shaped conductor 482. In this embodiment, as shown in FIG. 10, power is forcibly supplied in 180° inversion to the capacitor 451 and capacitor 453 through a bridge circuit formed by capacitors 471, 472 and 473 and inductances 474 and 475 connected to a power supply point 476 (which is connected to the 90° phase power divider described in the first embodiment). (Though not shown, a similar bridge circuit is connected to the capacitors 452 and 454.) With this type of differential power supply circuit, frequency adjustment of the RF coil may be effected by adjusting the capacitor 471 connected centrally of the bridge circuit. Since the adjustment of only one capacitor 471 is adequate, it is unnecessary to balance the capacitors 451 and 453 when selecting these capacitors 451 and 453 for frequency adjustment. That is, the capacitors 451 and 453 may be balanced only once, and thereafter only the capacitor 471 may be varied.

When the linear conductors 411–422 are arranged in inaccurate positions to form asymmetry and impair the orthogonality of magnetic fields due to manufacturing errors or the like, linearity may be secured with ease by properly selecting the capacitors 461–464 included in the ring-shaped conductor 481. In this case, however, modification of capacitors 451–454 may result in the orthogonality being lost and the uniformity of magnetic fields deviating from what is ideal.

The device for supplying power to the orthogonal RF coil in the second embodiment is not limited to the construction shown in FIG. 10, but may employ the differential power supply circuit described in the first embodiment with reference to FIG. 7. With such a device, the undesirable differential mode currents may be canceled effectively in the orthogonal RF coil in the second embodiment as well.

The number and positional relationship of the linear conductors in the described embodiments are only by way of example, and should not be construed to be limitative.

The present invention may be embodied in other specific forms without departing from the spirit or essential attributes thereof and, accordingly, reference should be made to the appended claims, rather than to the foregoing specification, as indicating the scope of the invention.

What is claimed is:

1. An orthogonal RF coil for use in an MRI apparatus, comprising:

two resonator coil loops arranged to have sensitivity directions orthogonal to each other, each of said resonator coil loops having two power supply points; and power supply means for supplying power so as to provide a 90° RF phase difference between the two power supply points of one of said resonator coil loops and the two power supply points of the other resonator coil loop, and a 180° RF phase difference between the two power supply points of each of said resonator coil loops at a frequency establishing a differential mode, said power supply means including a 90° phase power divider for outputting two high frequency signals having a 90° phase difference therebetween;

a first differential power supply circuit for receiving a 0° phase high frequency signal from said 90° phase power divider, and generating a 0° phase high frequency signal and 180° phase high frequency signal, said first differential power supply circuit outputting said 0° phase high frequency signal to one of said power supply points of one of said resonator coil loops, and outputting said 180° phase high frequency signal to the other power supply point of said one of said resonator coil loops; and a second differential power supply circuit for receiving a 90° phase high frequency signal from said 90° phase power divider, and generating a 90° phase high frequency signal and 270° phase high frequency signal, said second differential power supply circuit outputting said 90° phase high frequency signal to one of said power supply points of the other resonator coil loop, and outputting said 270° phase high frequency signal to the other power supply point of said other resonator coil.

2. An orthogonal RF coil as defined in claim 1, wherein said two resonator coil loops are formed by:
   four linear conductors extending parallel to one another and arranged at substantially 90° intervals in a circumferential direction; and
   two ring-shaped conductors to which opposite ends of said linear conductors are connected through first capacitors, respectively;
   said power supply points being disposed at connections where said linear conductors are connected through said first capacitors to one of said ring-shaped conductors.

3. An orthogonal RF coil as defined in claim 2, wherein said two ring-shaped conductors include second capacitors arranged between said connections to which said linear conductors are connected, respectively.

4. An orthogonal RF coil as defined in claim 1, wherein said two resonator coil loops are formed by:
   four x n (n being an integer 2 or more) linear conductors extending parallel to one another and arranged in a circumferential direction, said linear conductors being joined together at one end thereof to form four groups of n linear conductors each, said groups being arranged at substantially 90° intervals;
   a first ring-shaped conductor to which the other end of said linear conductors are connected through first capacitors, respectively; and
   a second ring-shaped conductor to which said groups of said linear conductors joined together at said one end are connected through second capacitors, respectively;
   said power supply points being disposed at connections where said groups of said linear conductors are connected through said second capacitors to said second ring-shaped conductor.

5. An orthogonal RF coil as defined in claim 4, wherein said first and second ring-shaped conductors include third capacitors arranged between said connections to which said linear conductors are connected, respectively.

6. An orthogonal RF coil as defined in claim 4, wherein each of said groups includes an odd number of said linear conductors.

7. An orthogonal RF coil as defined in claim 6, wherein each of said groups includes three linear conductors, said linear conductors being arranged at 30° angles in said circumferential direction.

8. An orthogonal RF coil as defined in claim 1, wherein each of said first and second differential power supply circuits includes a bridge circuit with two capacitors opposed to each other and having the same capacity C, and two inductances opposed to each other and having the same value L, said capacity C and said value L satisfying $(\frac{1}{2}\pi) \sqrt{C \cdot L} = f$ (where f is a resonance frequency establishing said differential mode);

said bridge circuit of said first differential power supply circuit including two opposed connecting points connected to the two power supply points of said one of said resonator coil loops, respectively, and two further opposed connecting points connected through a transmission line to a 0° phase high frequency signal output terminal of said 90° phase power divider; and said bridge circuit of said second differential power supply circuit including two opposed connecting points connected to the two power supply points of said other resonator coil loop, respectively, and two further opposed connecting points connected through a transmission line to a 90° phase high frequency signal output terminal of said 90° phase power divider.

9. An orthogonal RF coil as defined in claim 8, wherein said capacity C of said two capacitors and said inductance L of said two inductors are selected to satisfy $L/C = Z_o \cdot Z_i$ where $Z_o$ is impedance of the orthogonal RF coil, and $Z_i$ is impedance of the transmission line leading to said 90° phase power divider.

10. An orthogonal RF coil as defined in claim 8, wherein at least one of said capacitors included in said bridge circuit is a variable capacitor.

11. An orthogonal RF coil as defined in claim 8, wherein each of said first and second differential power supply circuits further includes:
   a parallel resonance circuit with a different capacitor and a different inductance, said parallel resonance circuit having the same resonance frequency as a resonance frequency establishing said differential mode, and having a switch connected in series to said different capacitor; and
   a different variable capacitor connected in series to said parallel resonance circuit;
   one end of said parallel resonance circuit being connected along with one of said connecting points of said bridge circuit to one of said power supply points of said one of said resonator coil loops, and one end of said different variable capacitor being connected along with the other connecting point of said bridge circuit to the other power supply point of said one of said resonator coil loops.

12. An orthogonal RF coil as defined in claim 8, wherein said bridge circuit of each of said first and second differential power supply circuits includes a variable capacitor connected between said connecting points connected to said power supply points of one of said resonator coil loops.

* * * * *